(12) United States Patent
Nakatsuka et al.

(10) Patent No.: US 11,677,411 B2
(45) Date of Patent: Jun. 13, 2023

(54) A/D CONVERTER, SENSOR PROCESSING CIRCUIT, AND SENSOR SYSTEM

(71) Applicant: Panasonic Intellectual Property Management Co., Ltd., Osaka (JP)

(72) Inventors: Junji Nakatsuka, Osaka (JP); Hiroki Yoshino, Nara (JP); Jun'ichi Naka, Osaka (JP); Koji Obata, Osaka (JP); Masaaki Nagai, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 91 days.

(21) Appl. No.: 17/442,088

(22) PCT Filed: Feb. 28, 2020

(86) PCT No.: PCT/JP2020/008267
§ 371 (c)(1),
(2) Date: Sep. 22, 2021

(87) PCT Pub. No.: WO2020/195534
PCT Pub. Date: Oct. 1, 2020

(65) Prior Publication Data
US 2022/0173746 A1 Jun. 2, 2022

(30) Foreign Application Priority Data
Mar. 28, 2019 (JP) .............................. JP2019-065091

(51) Int. Cl.
*H03M 1/14* (2006.01)
*H03M 1/38* (2006.01)
(Continued)

(52) U.S. Cl.
CPC ............... *H03M 1/14* (2013.01); *H03M 1/38* (2013.01); *H03M 3/438* (2013.01); *H03M 3/458* (2013.01); *G01D 7/00* (2013.01)

(58) Field of Classification Search
CPC .......... H03M 1/14; H03M 1/38; H03M 3/438; H03M 3/458; H03M 3/46; H03M 1/466; G01D 7/00
(Continued)

(56) References Cited

U.S. PATENT DOCUMENTS 9,325,340 B2 * 4/2016 Gonen ..................... H03M 1/42
9,660,662 B2 * 5/2017 Venca ...................... H03M 1/68
(Continued)

FOREIGN PATENT DOCUMENTS

JP H02-062124 A 3/1990
JP 2017-079451 A 4/2017
(Continued)

OTHER PUBLICATIONS

Chae, Youngcheol et al., "A 2.1 M Pixels, 120 Frame/s CMOS Image Sensor With Column-Parallel ΔΣ ADC Architecture," IEEE Jounal of Solid-State Circuits, Jan. 2011, vol. 46, No. 1, pp. 236-247, fig. 3(a), 6(a).
(Continued)

*Primary Examiner* — Khai M Nguyen
(74) *Attorney, Agent, or Firm* — McDermott Will & Emery LLP

(57) ABSTRACT

An A/D converter includes an A/D conversion unit and an output unit. The A/D conversion unit includes a second A/D converter (successive approximation register A/D converter) and generates first digital data having a first number of bits and second digital data having a second number of bits, where the second number of bits is smaller than the first number of bits. The output unit provides first output information that is the first digital data and also provides second output information based on the second digital data. The
(Continued)

output unit provides the second output information before providing the first output information.

12 Claims, 5 Drawing Sheets

(51) Int. Cl.
*H03M 3/00* (2006.01)
*G01D 7/00* (2006.01)

(58) Field of Classification Search
USPC .................. 341/143, 155–156, 163, 172
See application file for complete search history.

(56) References Cited

U.S. PATENT DOCUMENTS

2017/0208285 A1 7/2017 Yu
2018/0160066 A1 6/2018 Matsuzawa et al.
2018/0205388 A1 7/2018 Aruga et al.

FOREIGN PATENT DOCUMENTS

| JP | 2017-147712 A | 8/2017 |
| JP | 2018-152839 A | 9/2018 |
| WO | 2016/147523 A1 | 9/2016 |

OTHER PUBLICATIONS

International Search Report and Written Opinion issued in International Patent Application No. PCT/JP2020/008267, dated May 26, 2020; with partial English translation.

* cited by examiner

A/D CONVERTER, SENSOR PROCESSING CIRCUIT, AND SENSOR SYSTEM

CROSS-REFERENCE OF RELATED APPLICATIONS

This application is the U.S. National Phase under 35 U.S.C. § 371 of International Patent Application No. PCT/JP2020/008267, filed on Feb. 28, 2020, which in turn claims the benefit of Japanese Application No. 2019-065091, filed on Mar. 28, 2019, the entire disclosures of which Applications are incorporated by reference herein.

TECHNICAL FIELD

The present disclosure generally relates to an analog-to-digital converter (AID converter), a sensor processing circuit, and a sensor system, and more particularly relates to an A/D converter for digitally converting an analog signal, a sensor processing circuit, and a sensor system.

BACKGROUND ART

A noise-shaping successive approximation register (SAR) A/D converter has been proposed in the art to achieve as high a resolution as that of a ΔΣ A/D converter while maintaining the power consumption as low as that of an SAR A/D converter (see, for example, Patent Literature 1).

The noise-shaping SAR A/D converter of Patent Literature 1 has a configuration in which an integration circuit is provided as an additional constituent element for a normal SAR A/D converter. In the noise-shaping SAR A/D converter of Patent Literature 1, after a successive comparison operation has been performed to the least significant bit (LSB), the residual voltages of a capacitive digital-to-analog converter (DAC) are subjected to an integration operation, and the resultant integrated value is fed back when sampling is performed next time, thus allowing output data to have a noise-shaping characteristic.

To increase the resolution of the output data of an A/D converter, it takes a long time to have digital conversion processing done, thus causing an increase in latency.

CITATION LIST

Patent Literature

Patent Literature 1: JP 2017-147712 A

SUMMARY OF INVENTION

In view of the foregoing background, it is therefore an object of the present disclosure to provide an A/D converter, a sensor processing circuit, and a sensor system, all of which contribute to achieving a higher resolution and lower latency.

An A/D converter according to an aspect of the present disclosure includes an A/D conversion unit and an output unit. The A/D conversion unit includes a successive approximation register A/D converter and generates first digital data having a first number of bits and second digital data having a second number of bits, where the second number of bits is smaller than the first number of bits. The output unit provides first output information that is the first digital data and also provides second output information based on the second digital data. The output unit provides the second output information before providing the first output information.

A sensor processing circuit according to another aspect of the present disclosure is a sensor processing circuit including the A/D converter. The A/D converter converts an analog signal from a sensor into digital data and outputs the digital data to a control circuit.

A sensor system according to still another aspect of the present disclosure includes the sensor processing circuit and the sensor.

DESCRIPTION OF EMBODIMENTS

Note that the embodiment and its variations to be described below are only examples of the present disclosure and should not be construed as limiting. Rather, the exemplary embodiment and its variations may be readily modified in various manners depending on a design choice or any other factor without departing from a true spirit and scope of the present disclosure.

Embodiment

(1) Configuration

Figure 1:
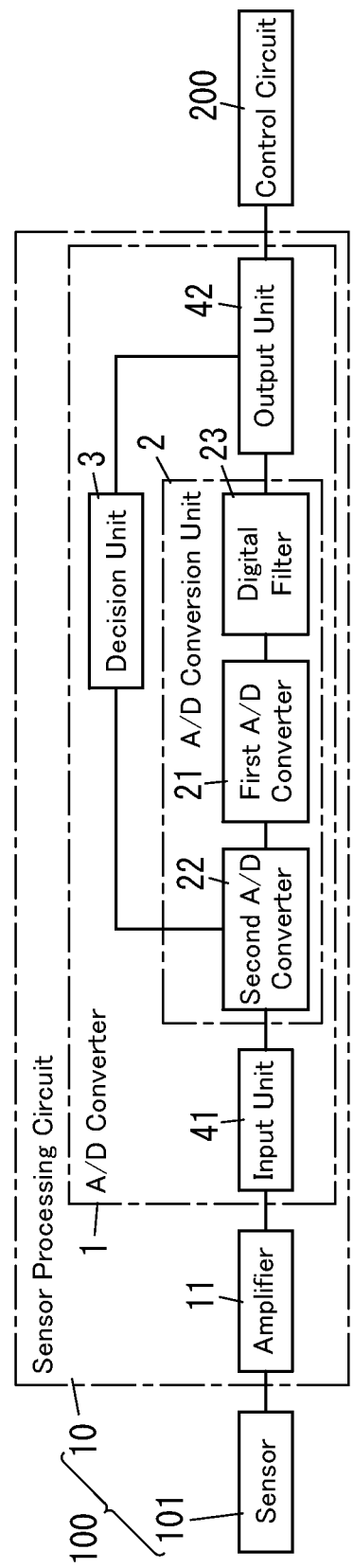
FIG. 1 is a block diagram of a sensor system including an A/D converter according to an exemplary embodiment of the present disclosure.

FIG. 1 is a block diagram of a sensor system 100 including an A/D converter (analog-to-digital converter) 1 according to an exemplary embodiment.

The A/D converter 1 according to this embodiment is used in an analog front end (sensor processing circuit 10) of the sensor system 100 and is configured to convert an analog signal supplied from a sensor 101 into digital data.

The sensor processing circuit 10 includes the A/D converter 1 and an amplifier 11, performs signal processing on a signal supplied from the sensor 101, and outputs the signal thus processed to a control circuit 200.

The sensor system 100 includes the sensor 101 and the sensor processing circuit 10.

Figure 2:
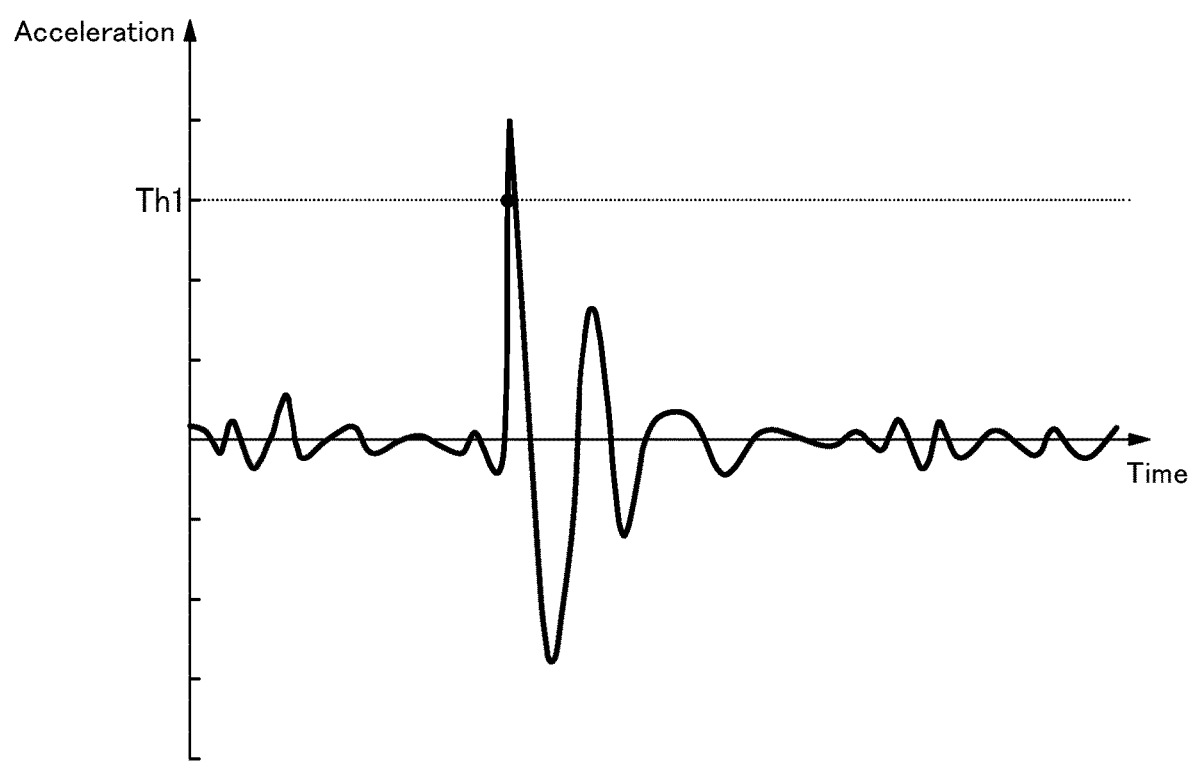
FIG. 2 shows the waveform of an analog signal output by a sensor in the sensor system.

The sensor 101 is configured to detect a physical quantity of a target of measurement or the magnitude of variation thereof. The sensor 101 outputs an analog signal (see FIG. 2), of which the amplitude is represented by a voltage value based on the result of the detection, to the sensor processing circuit 10. That is to say, the sensor 101 functions as a signal output unit for outputting an analog signal. The sensor processing circuit 10 converts the analog signal supplied from the sensor 101 into digital data and outputs the digital data to the control circuit 200.

In this embodiment, the sensor system 100 is applicable, for example, to moving vehicles such as automobiles. In that case, the sensor 101 may be implemented as an acceleration sensor for detecting the acceleration of a moving vehicle as the target of measurement. The control circuit 200 receiving the result of detection by the sensor 101 may be implemented as an electronic control unit (ECU) as a piece of onboard equipment installed in an automobile. However, this is only an example and should not be construed as limiting. The sensor 101 does not have to be an acceleration sensor but may also be a gyrosensor, a pressure sensor, or a motion sensor, for example. Also, the sensor system 100 is also applicable to a different type of device, instead of a moving vehicle such as an automobile.

The sensor processing circuit 10 is an analog front end for performing signal processing on an analog signal supplied from the sensor 101 and outputting the resultant data to the control circuit 200.

The sensor processing circuit 10 includes the A/D converter 1 and the amplifier 11.

The amplifier 11 is configured to amplify the analog signal supplied from the sensor 101. The amplifier 11 receives the analog signal as an output signal of the sensor 101. The amplifier 11 amplifies the amplitude of the input analog signal by a predetermined amplification factor and outputs the signal with the amplified amplitude to the A/D converter 1 connected thereto to follow the amplifier 11.

The A/D converter 1 includes an A/D conversion unit 2, a decision unit 3, an input unit 41, and an output unit 42. The A/D converter 1 converts the amplitude of the analog signal into digital data having a prescribed number of bits and outputs the digital data thus obtained to the control circuit 200. In this embodiment, the A/D converter 1 may be configured to, for example, output 21-bit digital data. Note that the number of bits of the digital data output by the A/D converter 1 does not have to be 21 bits.

The input unit 41 is electrically connected to the amplifier 11. The input unit 41 receives, via the amplifier 11, the analog signal as an output signal of the sensor 101.

The A/D conversion unit 2 includes a first A/D converter 21, a second A/D converter 22, and a digital filter 23. The first A/D converter 21 and the second A/D converter 22 have mutually different A/D conversion architectures and are cascaded (i.e., connected in series). The second A/D converter 22 is arranged to precede the first A/D converter 21. That is to say, the A/D converter 1 according to this embodiment is a hybrid A/D converter having a plurality of A/D conversion architectures.

The second A/D converter 22 is implemented as a successive approximation register (SAR) A/D converter. The second A/D converter 22 includes a capacitive digital-to-analog (D/A) converter. The capacitive D/A converter includes a plurality of capacitors (capacitive elements). Each of the capacitors has one terminal thereof electrically connected to the input unit 41 and the other terminal thereof selectively electrically connected to either a first voltage source or a second voltage source. The first voltage source and the second voltage source have mutually different output voltages.

The second A/D converter 22 successively and repeatedly performs the operation of comparing the amplitude voltage of the analog signal with the voltage generated by the capacitive D/A converter, thereby generating multi-bit digital data. Specifically, the A/D conversion unit 2 includes a comparator and a successive approximation register control circuit. The comparator compares the input voltage received by the input unit 41 (i.e., the amplitude of the analog signal) with the voltage generated by the capacitive D/A converter (reference voltage for comparison). Then, the successive approximation register control circuit generates, based on the result of comparison made by the comparator, a successive comparison control signal of the next bit, and outputs the control signal to the capacitive D/A converter. In accordance with the successive comparison control signal, each capacitor of the capacitive D/A converter has the other terminal thereof selectively electrically connected to either the first voltage source or the second voltage source. The second A/D converter 22 performs this successive comparison operation repeatedly, thereby generating multi-bit digital data. In this embodiment, the second A/D converter 22 generates 9-bit digital data, for example.

The first A/D converter 21 is implemented as a $\Delta\Sigma$ A/D converter. The first A/D converter 21 includes a subtractor, an integrator, a quantizer, and a D/A converter and performs $\Delta\Sigma$ modulation. The subtractor is implemented as a differential amplifier. The subtractor receives a reference signal and the residual voltage of the capacitive D/A converter (corresponding to a quantization noise) after the successive comparison operation has been performed by the second A/D converter 22. The subtractor subtracts the reference signal from the residual voltage. The integrator calculates a cumulative value by adding together the calculation results obtained by the subtractor. The quantizer determines a 1-bit digital value by comparing the calculation result obtained by the integrator with the reference signal. The result thus obtained by the quantizer is output to the digital filter 23 arranged to follow the first A/D converter 21 and to the D/A converter. The D/A converter is implemented as a 1-bit D/A converter and determines, based on the result obtained by the quantizer, the reference signal to be fed back to the subtractor.

Optionally, the first A/D converter 21 may also be implemented as a high-order $\Delta\Sigma$ A/D converter including a plurality of subtractors and a plurality of integrators. The higher the order of the first A/D converter 21 is, the higher the frequency range, in which the quantization noise is generated, may be. This allows the conversion accuracy to be improved.

The digital filter 23 performs filter processing on the output of the first A/D converter 21. The digital filter 23 has a band limitation function and a decimation function as its functions for the filter processing. The output of the first A/D converter 21 implemented as a $\Delta\Sigma$ A/D converter includes RF noise generated by noise shaping of a quantization noise and has a data rate higher than its original sampling frequency as a result of over sampling. Thus, the digital filter 23 reduces the RF noise by using the band limitation function and also lowers the data rate by using the decimation function. The digital filter 23 generates multi-bit digital data by performing filter processing on the 1-bit output of the first A/D converter 21. In this embodiment, the digital filter 23 generates 12-bit digital data, for example, by performing filter processing on the output of the first A/D converter 21.

The A/D conversion unit 2 generates 21-bit (representing a first number of bits) digital data (corresponding to first digital data), of which the high-order bits are the 9-bit digital data generated by the second A/D converter 22 and the low-order bits are the 12-bit digital data generated by the first A/D converter 21 and the digital filter 23.

The decision unit 3 determines whether or not the digital data consisting of the high-order bits (corresponding to the second digital data) of the digital data provided as output data of the A/D conversion unit 2 satisfies a predetermined condition. As used herein, the predetermined condition is that the second digital data is equal to or greater than a threshold value Th1 (see FIG. 2). The second digital data is digital data consisting of the 3 most significant bits (representing the second number of bits) out of the 9-bit digital data generated by the second A/D converter 22. That is to say, the second digital data consists of the high-order bits of the digital data generated by the second A/D converter 22. The threshold value Th1 is represented by 3-bit digital data.

In this embodiment, the sensor 101 is implemented as an acceleration sensor as a piece of onboard equipment installed in an automobile. The threshold value Th1 is set based on the acceleration generated when an automobile has had a collision. Thus, if the acceleration detected by the sensor 101 is equal to or greater than the threshold value Th1, a decision may be made that the automobile should have had a collision.

The decision unit 3 acquires the second digital data from the A/D conversion unit 2. In other words, the second A/D converter 22 outputs digital data consisting of the 3 most significant bits (corresponding to the second digital data) to the decision unit 3. In this case, every time the second A/D converter 22 performs the successive comparison operation, the second A/D converter 22 determines the values on a bit-by-bit basis in the descending order from the most significant bit (MSB). When the second A/D converter 22 performs the successive comparison operation three times, the second A/D converter 22 outputs the second digital data consisting of the 3 bits thus generated to the decision unit 3. That is to say, before finishing generating 9-bit digital data, the second A/D converter 22 outputs the second digital data to the decision unit 3.

The decision unit 3 generates 1-bit digital data (corresponding to second output information) indicating the result of decision made about whether the predetermined condition is satisfied or not. That is to say, the decision unit 3 generates 1-bit digital data based on the result of comparison between the second digital data and the threshold value Th1. For example, if the second digital data is equal to or greater than the threshold value Th1, the decision unit 3 may set the output value at "1." On the other hand, if the second digital data is less than the threshold value Th1, the decision unit 3 may set the output value at "0." That is to say, the decision unit 3 generates, as the second output information, data, of which the number of bits is smaller than that of the second digital data.

The output unit 42 has a plurality of output ports and provides the first output information and the second output information to the control circuit 200. The first output information is the first digital data of 21 bits (representing the first number of bits) generated by the A/D conversion unit 2. The second output information is information based on the second digital data of 3 bits (representing the second number of bits) generated by the A/D conversion unit 2. In this embodiment, the second output information is 1-bit digital data generated by the decision unit 3. That is to say, the second output information includes the result of decision made about whether or not the second digital data satisfies the predetermined condition.

The output unit 42 provides the first output information of 21 bits (corresponding to the first digital data) and the second information of 1 bit to the control circuit 200. The output unit 42 has twenty-two output ports provided for the first output information of 21 bits and the second output information of 1 bit, respectively.

In this embodiment, the second digital data that forms the basis of the second output information is the 3 most significant bits out of the 9-bit digital data generated by the second A/D converter 22 and is output to the decision unit 3 before the second A/D converter 22 finishes generating the 9-bit digital data. Meanwhile, after the second A/D converter 22 has generated the 9-bit digital data, the first digital data will be generated by $\Delta\Sigma$ modulation by the first A/D converter 21 and by the filter processing by the digital filter 23. The $\Delta\Sigma$ modulation by the first A/D converter 21 and the filter processing by the digital filter 23 take a longer time than the second digital data decision processing by the decision unit 3 does. Thus, the second output information is generated prior to the first output information. The output unit 42 provides the second output information before providing the first output information. That is to say, the latency (time delay) of the second output information is less than the latency of the first output information.

Exemplary Operation

Figure 3:
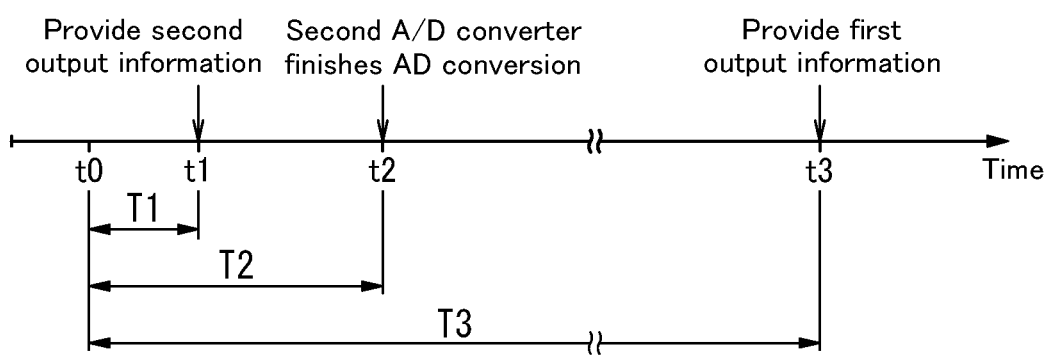
FIG. 3 illustrates how the A/D converter operates.

An exemplary operation of the A/D converter 1 according to this embodiment will be described with reference to FIG. 3.

Suppose at a point in time to, the input unit 41 receives an analog signal, of which the amplitude is greater than the threshold value Th1.

The second A/D converter 22 of the A/D conversion unit 2 generates multi-bit digital data by performing the successive comparison operation repeatedly.

Next, at a point in time t1, the second A/D converter 22 finishes generating the 3-bit digital data (corresponding to the second digital data) and outputs the digital data to the decision unit 3. In this exemplary operation, the second digital data obtained by converting the analog signal into digital data is greater than the threshold value Th1. Thus, the decision unit 3 decides that the second digital data should satisfy the predetermined condition. The output unit 42 outputs the result of decision (1-bit digital data) made by the decision unit 3 as the second output information to the control circuit 200. Note that strictly speaking, a time lag is caused by the decision processing performed by the decision unit 3 and the signal processing performed by the output unit 42 between the point in time when the second A/D converter 22 has generated the second digital data and the point in time when the output unit 42 provides the second output information. However, the time lag is insignificant, and therefore, ignored in this example.

Next, at a point in time t2, the second A/D converter 22 finishes performing the successive comparison operation to generate 9-bit digital data. Then, the first A/D converter 21 starts performing the $\Delta\Sigma$ modulation. Meanwhile, the digital filter 23 starts performing filter processing on the output of the first A/D converter 21.

Thereafter, at a point in time t3, the digital filter 23 finishes performing the filter processing. That is to say, the first digital data of 21 bits, of which the high-order bits are defined by the 9-bit digital data generated by the second A/D converter 22 and the low-order bits are defined by the 12-bit digital data generated by the first A/D converter 21 and the digital filter 23, finishes being generated. The output unit 42 provides the first digital data as the first output information to the control circuit 200. Note that strictly speaking, a time lag is caused by the signal processing performed by the output unit 42 between the point in time when the digital filter 23 finishes performing the filter processing and the point in time when the output unit 42 provides the first output information. However, the time lag is insignificant, and therefore, ignored in this example.

For example, the A/D conversion unit 2 is supposed to have an operating clock frequency of 1 MHz. In that case, it takes three clock periods for the second A/D converter 22 to generate the second digital data of 3 bits. Therefore, the time period T1 from the point in time t0 to the point in time t1 when the second output information is provided has a length of approximately 3 μs.

Also, it takes nine clock periods for the second A/D converter 22 to generate the 9-bit digital data. Therefore, the time period T2 from the point in time t0 to the point in time t2 when the second A/D converter 22 generates the 9-bit digital data has a length of approximately 9 μs.

Furthermore, it takes 1024 clock periods for the digital filter 23 to perform filter processing on the output of the first A/D converter 21. Therefore, the time period T3 from the point in time t0 to the point in time t3 when the first output information is provided has a length of approximately 1 ms.

As can be seen, the A/D converter 1 according to this embodiment provides the second output information prior to the first output information. The first digital data as the first output information has a higher resolution (i.e., a larger number of bits), but causes higher latency, than the second digital data that forms the basis of the second output information. In other words, the second digital data has a lower resolution, but causes lower latency, than the first digital data. This allows the A/D converter 1 according to this embodiment to provide the first output information having the higher resolution and the second output information causing the lower latency, thus contributing to allowing the output data to have a higher resolution and lower latency.

In addition, the control circuit 200 may receive the second output information based on the second digital data having the lower resolution before receiving the first digital data (corresponding to the first output information) having the higher resolution. In this embodiment, the second output information includes the result of decision made about whether the second digital data satisfies the predetermined condition, i.e., whether or not the second digital data is equal to or greater than the threshold value Th1. This allows the control circuit 200 to detect, before receiving the first output information (first digital data), an abnormal state where the analog signal has an amplitude equal to or greater than the threshold value Th1. Thus, the control circuit 200 may more quickly perform the operation to be performed when any abnormal state has arisen. That is to say, this contributes to increasing the responsivity of the control circuit 200 from the point in time when the abnormal state has arisen to the point in time when the control circuit 200 starts performing its operation to cope with the abnormality.

In addition, the control circuit 200 may receive the first digital data having the higher resolution (corresponding to the first output information) separately from the second output information, and therefore, may control the target of control accurately based on the first digital data.

Variations

Next, variations of the A/D converter 1 according to the exemplary embodiment will be described.

First Variation

In the example described above, the output unit 42 is configured to output, as the second output information, 1-bit digital data indicating the result of decision made by the decision unit 3. However, this is only an example and should not be construed as limiting. Alternatively, the output unit 42 may also be configured to output the second digital data as the second output information.

In this variation, the decision unit 3 compares the second digital data provided by the second A/D converter 22 with the threshold value Th1. Then, when finding the second digital data equal to or greater than the first threshold value Th1 (i.e., if the predetermined condition is satisfied), the decision unit 3 outputs the second digital data to the output unit 42.

If the output unit 42 has received the second digital data from the decision unit 3, then the output unit 42 outputs the second digital data to the control circuit 200. That is to say, if the predetermined condition is satisfied, the output unit 42 provides the second digital data as the second output information.

The output unit 42 outputs the second digital data of 3 bits (corresponding to the second output information) by using three output ports corresponding to the 3 most significant bits out of the first digital data of 21 bits. That is to say, the output unit 42 outputs only the second digital data (corresponding to the second output information) consisting of the 3 most significant bits out of the first digital data earlier than the first digital data. Thus, some of the twenty-one output ports for use to provide the first output information (corresponding to the first digital data) also serve as output ports for providing the second output information. This eliminates the need to provide dedicated output ports for providing only the second output information, thus contributing to simplifying the configuration.

In addition, if the predetermined condition is satisfied, the output unit 42 provides the second digital data as the second output information. However, this is only an example and should not be construed as limiting.

Alternatively, the output unit 42 may acquire the second digital data from the second A/D converter 22 and output the second digital data as the second output information, no matter whether the predetermined condition is satisfied or not. That is to say, the output unit 42 alternately and repeatedly provides the second output information as the second digital data and the first output information as the first digital data every predetermined sampling period. This configuration eliminates the need to use the decision unit 3, thus contributing to simplifying the configuration.

Second Variation

In the example described above, the predetermined condition is that the second digital data should be equal to or greater than the threshold value Th1. That is to say, if the second digital data exceeds the threshold value Th1 even once, the decision is made that the predetermined condition should be satisfied. However, the predetermined condition does not have to be such a condition.

The predetermined condition may also be that the second digital data should remain equal to or greater than the threshold value Th1 consecutively at least a prescribed number of times. The prescribed number of times may be, for example, three times, five times, or any other multiple times.

The decision unit 3 compares the second digital data with the threshold value Th1 and increases, when finding the second digital data equal to or greater than the threshold value Th1, the count of a counter. Also, if the decision unit 3 finds the second digital data equal to or greater than the threshold value Th1 and the count of the counter is less than a prescribed number of times, the A/D conversion unit 2 cancels the A/D conversion processing halfway. That is to say, the A/D conversion unit 2 cancels the generation of the first digital data. Then, the A/D conversion unit 2 converts the amplitude of a newly input analog signal into a digital value, thereby generating second digital data. Note that if the second digital data is less than the threshold value Th1, the decision unit 3 resets the count of the counter.

Then, the decision unit 3 compares the second digital data with the threshold value Th1. If the second digital data is equal to or greater than the threshold value Th1 and the count of the counter has reached a prescribed number of times, the decision unit 3 outputs the 1-bit digital data or second digital data indicating the result of comparison to the control circuit 200 via the output unit 42. That is to say, if the second digital data remains equal to or greater than the threshold value Th1 consecutively at least the prescribed number of times, then the output unit 42 provides the second output information to the control circuit 200. If the decision unit 3 has decided that the second digital data should be equal to or greater than the threshold value Th1 and the count of the counter has reached the prescribed number of times, the A/D conversion unit 2 generates the first digital data without canceling the A/D conversion processing halfway and outputs the first digital data to the control circuit 200 via the output unit 42.

This prevents, even if the second digital data has become equal to or greater than the threshold value Th1 accidentally due to noise, for example, the second output information from being provided. Thus, the control circuit 200 may reduce the chances of erroneously detecting an abnormal state where the amplitude of an analog signal becomes equal to or greater than the threshold value Th1.

Note that the predetermined condition does not have to demand that the second digital data should remain equal to or greater than the threshold value Th1 consecutively at least the prescribed number of times. That is to say, the predetermined condition may also be that the second digital data should be equal to or greater than the threshold value Th1 at least the prescribed number of times. For example, the predetermined condition may also be that the second digital data should be equal to or greater than the threshold value Th1 at least the prescribed number of times during a predefined period. Alternatively, the predetermined condition may also be that the second digital data should be equal to or greater than the threshold value Th1 at least a prescribed number of times out of a certain number of times.

Third Variation

Figure 4:
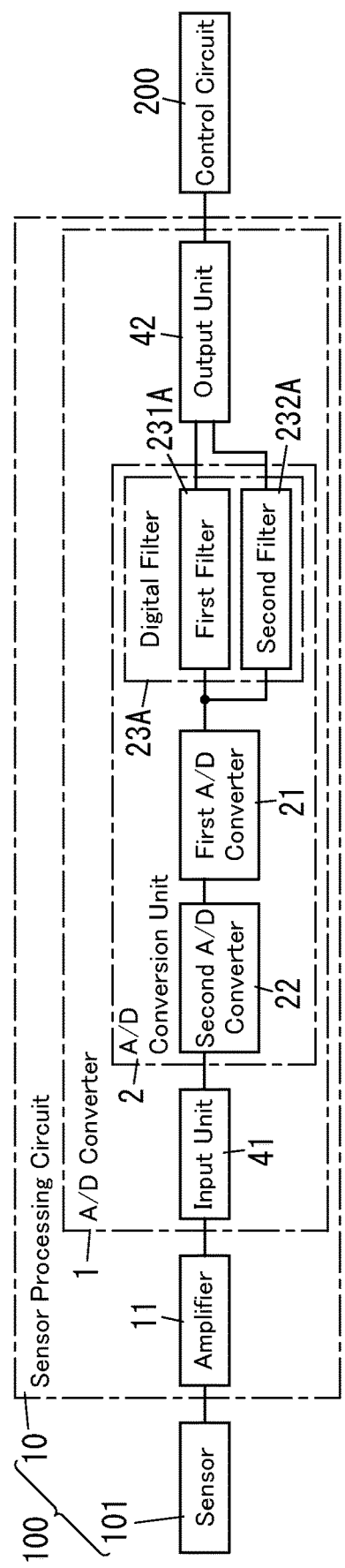
FIG. 4 is a block diagram of a sensor system including an A/D converter according to a third variation of the exemplary embodiment of the present disclosure.

An A/D converter 1 according to a third variation will be described with reference to FIG. 4.

Any constituent element of the third variation, having the same function as a counterpart of the A/D converter 1 of the embodiment described above, will be designated by the same reference numeral as that counterpart's, and description thereof will be omitted as appropriate herein.

The A/D converter 1 according to this variation includes a digital filter 23A including a first filter 231A and a second filter 232A.

The first filter 231A and the second filter 232A are connected in parallel. Each of the first filter 231A and the second filter 232A receives 1-bit digital data from the first A/D converter 21.

Each of the first filter 231A and the second filter 232A performs filter processing on the output of the first A/D converter 21. Each of the first filter 231A and the second filter 232A has a band limitation function and a decimation function as its functions for the filter processing. In other words, each of the first filter 231A and the second filter 232A includes a low-pass filter and a decimation filter.

Each of the first filter 231A and the second filter 232A generates multi-bit digital data by performing filter processing on the output of the first A/D converter 21. The second filter 232A has a lower resolution than the first filter 231A. In this variation, the first filter 231A generates 12-bit digital data by performing filter processing on the output of the first A/D converter 21. On the other hand, the second filter 232A generates 3-bit digital data by performing filter processing on the output of the first A/D converter 21.

The output unit 42 provides, as first output information, 21-bit (representing a first number of bits) digital data (corresponding to first digital data), of which the high-order bits are the 9-bit digital data generated by the second A/D converter 22 and the low-order bits are the 12-bit digital data generated by the first A/D converter 21 and the first filter 231A. In addition, the A/D conversion unit 2 further provides, as second output information. 12-bit (representing a second number of bits) digital data (corresponding to second digital data), of which the high-order bits are the 9-bit digital data generated by the second A/D converter 22 and the low-order bits are the 3-bit digital data generated by the first A/D converter 21 and the second filter 232A. The second digital data is the high-order bits of the first digital data.

In this case, the digital data generated by the second filter 232A has a lower resolution than the digital data generated by the first filter 231A. Thus, the second filter 232A requires a shorter filter processing time than the first filter 231A does. Consequently, the second digital data (corresponding to the second output information) is generated, and output to the control circuit 200, earlier than the first digital data (corresponding to the first output information). That is to say, the latency of the second output information is less than the latency of the first output information.

Optionally, the first filter 231A and the second filter 232A may be configured such that the digital data generated by the second filter 232A has a smaller effective number of bits than the digital data generated by the first filter 231A. As used herein, the "effective number of bits" is obtained as the ratio of the oversampling rate of the first A/D converter 21 implemented as a $\Delta\Sigma$ A/D converter to the output data rate of the first filter 231A or the second filter 232A, i.e., as a decimation ratio. The digital data generated by the second filter 232A has a smaller effective number of bits than the digital data generated by the first filter 231A. Thus, the second filter 232A requires a shorter filter processing time than the first filter 231A does. Consequently, the second digital data (corresponding to the second output information) is generated, and output to the control circuit 200, earlier than the first digital data (corresponding to the first output information). That is to say, the latency of the second output information is less than the latency of the first output information.

Fourth Variation

Figure 5:
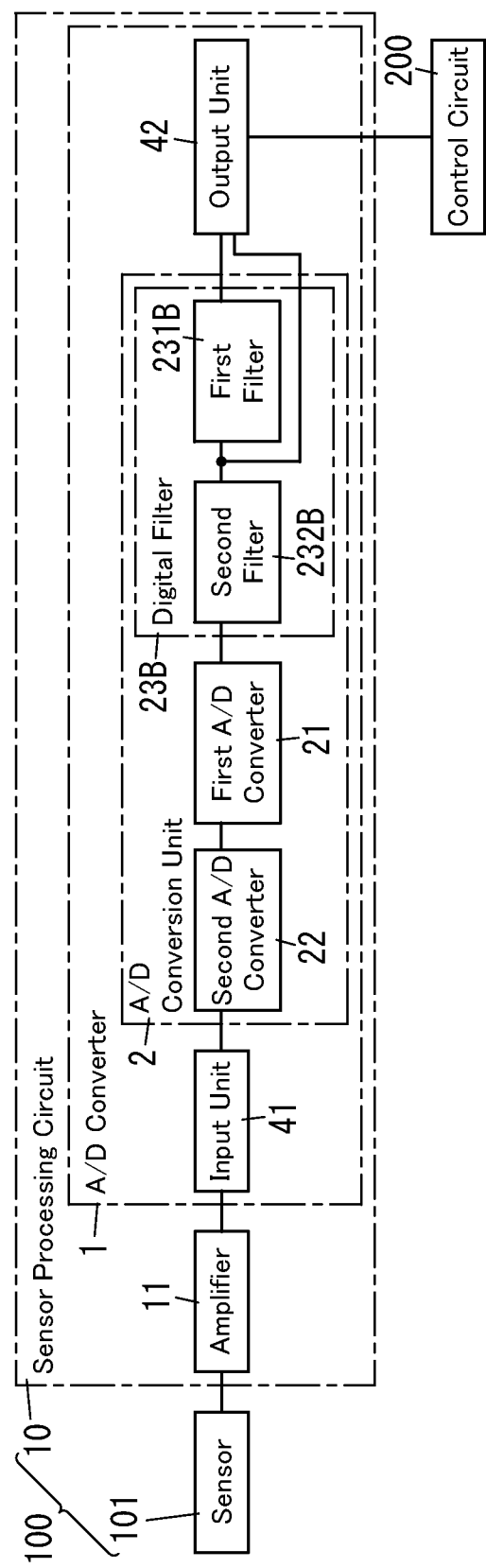
FIG. 5 is a block diagram of a sensor system including an A/D converter according to a fourth variation of the exemplary embodiment of the present disclosure.

An A/D converter 1 according to a fourth variation will be described with reference to FIG. 5.

Any constituent element of the fourth variation, having the same function as a counterpart of the A/D converter 1 of the embodiment or variations described above, will be designated by the same reference numeral as that counterpart's, and description thereof will be omitted as appropriate herein.

The A/D converter 1 according to this variation includes a digital filter 23B including a first filter 231B and a second filter 232B.

The first filter 231B and the second filter 232B are connected in series. The second filter 232B is arranged to precede the first filter 231B and receives 1-bit digital data from the first A/D converter 21.

The second filter 232B generates 3-bit digital data by performing filter processing on the output of the first A/D converter 21. The second filter 232B outputs the 3-bit digital data to the first filter 231B and the output unit 42.

The first filter 231B generates 12-bit digital data by performing filter processing on the 3-bit digital data supplied from the second filter 232B. That is to say, in this variation, the second filter 232B performs primary filter processing on the output of the first A/D converter 21 and the first filter 231B performs secondary filter processing on the output of the first A/D converter 21. As a result of the primary filter processing by the second filter 232B, digital data consisting of the 3 high-order bits is generated. As a result of the secondary filter processing by the first filter 231B, digital data consisting of the 9 low-order bits is generated. The first filter 231B outputs 12-bit digital data, which is the combination of the 3 high-order bits of the digital data generated through the primary filter processing and the 9 low-order bits of the digital data generated through the secondary filter processing, to the output unit 42.

The output unit 42 provides, as first output information. 21-bit (representing a first number of bits) digital data (corresponding to first digital data), of which the high-order bits are the 9-bit digital data generated by the second A/D converter 22 and the low-order bits are the 12-bit digital data generated by the first A/D converter 21 and the first filter 231B. In addition, the A/D conversion unit 2 further provides, as second output information. 12-bit (corresponding to a second number of bits) digital data (corresponding to second digital data), of which the high-order bits are the 9-bit digital data generated by the second A/D converter 22 and the low-order bits are the 3-bit digital data generated by the first A/D converter 21 and the second filter 232B. The second digital data is the high-order bits of the first digital data.

In this variation, the output of the first A/D converter 21 of the A/D conversion unit 2 is subjected to primary filter processing by the second filter 232B and to secondary filter processing by the first filter 231B. Consequently, the second digital data (corresponding to the second output information) is generated, and output to the control circuit 200, earlier than the first digital data (corresponding to the first output information). That is to say, the latency of the second output information is less than the latency of the first output information.

Other Variations

In the examples described above, the first A/D converter 21 is implemented as a ΔΣ A/D converter. However, this is only an example and should not be construed as limiting. Alternatively, the first A/D converter 21 may also be implemented as an A/D converter having any other A/D conversion architecture (such as a flash A/D converter).

Also, in the examples described above, the A/D converter 1 is implemented as a hybrid A/D converter having a plurality of A/D conversion architectures. However, this is only an example and should not be construed as limiting. Alternatively, the A/D converter 1 may also have a single A/D conversion architecture (i.e., may be a successive approximation register A/D converter).

Recapitulation

An A/D converter (1) according to a first aspect includes an A/D conversion unit (2) and an output unit (42). The A/D conversion unit (2) includes a successive approximation register A/D converter (second A/D converter 22) and generates first digital data having a first number of bits and second digital data having a second number of bits, where the second number of bits is smaller than the first number of bits. The output unit (42) provides first output information that is the first digital data and also provides second output information based on the second digital data. The output unit (42) provides the second output information before providing the first output information.

This aspect enables providing first output information having the higher resolution and second output information causing the lower latency, thus contributing to allowing the output data to have both a higher resolution and lower latency.

In an A/D converter (1) according to a second aspect, which may be implemented in conjunction with the first aspect, the second digital data is high-order bits of the first digital data.

This aspect enables the processing for generating the first digital data and the processing for generating the second digital data to be performed partially in common.

In an A/D converter (1) according to a third aspect, which may be implemented in conjunction with the first or second aspect, the second output information includes a result of decision made about whether or not a predetermined condition related to the second digital data is satisfied.

This aspect contributes to reducing the number of bits of the second output information.

In an A/D converter (1) according to a fourth aspect, which may be implemented in conjunction with the third aspect, the output unit (42) provides, when the predetermined condition is satisfied, the second digital data as the second output information.

This aspect enables determining, depending on whether the second output information is provided or not, whether or not the predetermined condition is satisfied.

In an A/D converter (1) according to a fifth aspect, which may be implemented in conjunction with the third or fourth aspect, the predetermined condition is that the second digital data is equal to or greater than a threshold value (Th1) at least a prescribed number of times.

This aspect may reduce the chances of making an erroneous decision about whether the predetermined condition is satisfied or not.

In an A/D converter (1) according to a sixth aspect, which may be implemented in conjunction with the fifth aspect, the predetermined condition is that the second digital data remains equal to or greater than the threshold value (Th1) consecutively at least the prescribed number of times.

This aspect may reduce the chances of making an erroneous decision about whether the predetermined condition is satisfied or not.

In an A/D converter (1) according to a seventh aspect, which may be implemented in conjunction with the first or second aspect, the output unit (42) provides the second digital data as the second output information.

This aspect enables the first digital data having the higher resolution and the second digital data causing the lower latency to be output alternately.

In an A/D converter (1) according to an eighth aspect, which may be implemented in conjunction with any one of the first to seventh aspects, the A/D conversion unit (2) includes: the successive approximation register A/D converter; and a ΔΣ A/D converter (first A/D converter 21) arranged to follow the successive approximation register A/D converter.

This aspect contributes to allowing the output data to have an even higher resolution.

In an A/D converter (1) according to a ninth aspect, which may be implemented in conjunction with the eighth aspect, the A/D conversion unit (2) further includes a digital filter (23A, 23B) to perform filter processing on output of the ΔΣ A/D converter. The digital filter (23A, 23B) includes a first filter (231A, 231B) and a second filter (232A, 232B). The first filter (231A, 231B) outputs the first digital data by performing the filter processing on the output of the ΔΣ A/D converter. The second filter (232A, 232B) outputs the second digital data by performing the filter processing on the output of the ΔΣ A/D converter.

This aspect enables the first digital data having the higher resolution and the second digital data causing the low latency to be generated through the filter processing performed by the digital filter (23A, 23B).

In an A/D converter (1) according to a tenth aspect, which may be implemented in conjunction with the eighth aspect, the second digital data is high-order bits of the digital data generated by the successive approximation register A/D converter.

This aspect contributes to allowing the second output information to have low latency.

A sensor processing circuit (10) according to an eleventh aspect is a sensor processing circuit including the A/D converter (1) according to any one of the first to tenth aspects. The A/D converter (1) converts an analog signal from a sensor (101) into digital data and outputs the digital data to a control circuit (200).

This aspect enables the A/D converter (1) to provide first output information having the higher resolution and second output information causing the lower latency, thus contributing to allowing the output data to have both a higher resolution and lower latency.

A sensor system (100) according to a twelfth aspect includes the sensor processing circuit (10) according to the eleventh aspect and the sensor (101).

This aspect enables the A/D converter (1) of the sensor processing circuit (10) to provide first output information having the higher resolution and second output information causing the lower latency, thus contributing to allowing the output data to have both a higher resolution and lower latency.

REFERENCE SIGNS LIST

1 A/D Converter
2 A/D Conversion Unit
21 First A/D Converter (ΔΣ A/D Converter)
22 Second A/D Converter (Successive Approximation Register A/D Converter)
23A, 23B Digital Filter
231A, 231B First Filter
232A, 232B Second Filter
42 Output Unit
10 Sensor Processing Circuit
100 Sensor System
101 Sensor
200 Control Circuit

The invention claimed is:

1. An A/D converter comprising:
an A/D conversion unit including a successive approximation register A/D converter and configured to generate first digital data having a first number of bits and second digital data having a second number of bits, where the second number of bits is smaller than the first number of bits; and
an output unit configured to provide first output information that is the first digital data and second output information based on the second digital data,
the output unit being configured to provide the second output information before providing the first output information.

2. The A/D converter of claim 1, wherein
the second digital data is high-order bits of the first digital data.

3. The A/D converter of claim 1, wherein
the second output information includes a result of decision made about whether or not a predetermined condition related to the second digital data is satisfied.

4. The A/D converter of claim 3, wherein
the output unit is configured to, when the predetermined condition is satisfied, provide the second digital data as the second output information.

5. The A/D converter of claim 3, wherein
the predetermined condition is that the second digital data is equal to or greater than a threshold value at least a prescribed number of times.

6. The A/D converter of claim 5, wherein
the predetermined condition is that the second digital data remains equal to or greater than the threshold value consecutively at least the prescribed number of times.

7. The A/D converter of claim 1, wherein
the output unit is configured to provide the second digital data as the second output information.

8. The A/D converter of claim 1, wherein
the A/D conversion unit includes: the successive approximation register A/D converter; and
a ΔΣ A/D converter arranged to follow the successive approximation register A/D converter.

9. The A/D converter of claim 8, wherein
the A/D conversion unit further includes a digital filter configured to perform filter processing on output of the ΔΣ A/D converter, and
the digital filter includes:
a first filter configured to output the first digital data by performing the filter processing on the output of the ΔΣ A/D converter; and
a second filter configured to output the second digital data by performing the filter processing on the output of the ΔΣ A/D converter.

10. The A/D converter of claim 8, wherein
the second digital data is high-order bits of the digital data generated by the successive approximation register A/D converter.

11. A sensor processing circuit comprising the A/D converter of claim 1, wherein
the A/D converter is configured to convert an analog signal from a sensor into digital data and output the digital data to a control circuit.

12. A sensor system comprising:
the sensor processing circuit of claim 11; and
the sensor.

* * * * *